(12) United States Patent
Chen et al.

(10) Patent No.: US 7,432,553 B2
(45) Date of Patent: Oct. 7, 2008

(54) STRUCTURE AND METHOD TO OPTIMIZE STRAIN IN CMOSFETS

(75) Inventors: Xiangdong Chen, Poughquag, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 390 days.

(21) Appl. No.: 10/905,745

(22) Filed: Jan. 19, 2005

(65) Prior Publication Data
US 2006/0157795 A1   Jul. 20, 2006

(51) Int. Cl.
*H01L 27/01* (2006.01)
*H01L 27/12* (2006.01)
*H01L 31/0392* (2006.01)
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/351; 257/369; 257/371
(58) Field of Classification Search ............ 257/274, 257/369–377, 351
See application file for complete search history.

(56) References Cited

U.S. PATENT DOCUMENTS

| | | | |
|---|---|---|---|
| 3,602,841 A | 8/1971 | McGroddy | |
| 4,665,415 A | 5/1987 | Esaki et al. | |
| 4,853,076 A | 8/1989 | Tsaur et al. | |
| 4,855,245 A | 8/1989 | Neppl et al. | |
| 4,952,524 A | 8/1990 | Lee et al. | |
| 4,958,213 A | 9/1990 | Eklund et al. | |
| 5,006,913 A | 4/1991 | Sugahara et al. | |
| 5,060,030 A | 10/1991 | Hoke | |

(Continued)

FOREIGN PATENT DOCUMENTS

EP    01/62362    6/1989

(Continued)

OTHER PUBLICATIONS

Rim, et al., "Transconductance Enhancement in Deep Submicron Strained-Si *n*-MOSFETs", International Electron Devices Meeting, 26, 8, 1, IEEE, Sep. 1998.

(Continued)

*Primary Examiner*—Cuong Q Nguyen
(74) *Attorney, Agent, or Firm*—Scully, Scott, Murphy & Presser, P.C.; Joseph P. Abate, Esq.

(57) ABSTRACT

A semiconductor structure of strained MOSFETs, comprising both PMOSFETs and NMOSFETS, and a method for fabricating strained MOSFETs are disclosed that optimize strain in the MOSFETs, and more particularly maximize the strain in one kind (P or N) of MOSFET and minimize and relax the strain in another kind (N or P) of MOSFET. A strain inducing CA nitride coating having an original full thickness is formed over both the PMOSFETs and the NMOSFETs, wherein the strain inducing coating produces an optimized full strain in one kind of semiconductor device and degrades the performance of the other kind of semiconductor device. The strain inducing CA nitride coating is etched to a reduced thickness over the other kind of semiconductor devices, wherein the reduced thickness of the strain inducing coating relaxes and produces less strain in the other MOSFETs.

6 Claims, 1 Drawing Sheet

U.S. PATENT DOCUMENTS

| | | | |
|---|---|---|---|
| 5,081,513 A | 1/1992 | Jackson et al. | |
| 5,108,843 A | 4/1992 | Ohtaka et al. | |
| 5,134,085 A | 7/1992 | Gilgen et al. | |
| 5,310,446 A | 5/1994 | Konishi et al. | |
| 5,354,695 A | 10/1994 | Leedy | |
| 5,371,399 A | 12/1994 | Burroughes et al. | |
| 5,391,510 A | 2/1995 | Hsu et al. | |
| 5,459,346 A | 10/1995 | Asakawa et al. | |
| 5,471,948 A | 12/1995 | Burroughes et al. | |
| 5,557,122 A | 9/1996 | Shrivastava et al. | |
| 5,561,302 A | 10/1996 | Candelaria | |
| 5,565,697 A | 10/1996 | Asakawa et al. | |
| 5,571,741 A | 11/1996 | Leedy et al. | |
| 5,592,007 A | 1/1997 | Leedy | |
| 5,592,018 A | 1/1997 | Leedy | |
| 5,670,798 A | 9/1997 | Schetzina | |
| 5,679,965 A | 10/1997 | Schetzina | |
| 5,683,934 A | 11/1997 | Candelaria | |
| 5,840,593 A | 11/1998 | Leedy | |
| 5,861,651 A | 1/1999 | Brasen et al. | |
| 5,880,040 A | 3/1999 | Sun et al. | |
| 5,940,736 A | 8/1999 | Brady et al. | |
| 5,946,559 A | 8/1999 | Leedy | |
| 5,960,297 A | 9/1999 | Saki | |
| 5,989,978 A | 11/1999 | Peidous | |
| 6,008,126 A | 12/1999 | Leedy | |
| 6,025,280 A | 2/2000 | Brady et al. | |
| 6,046,464 A | 4/2000 | Schetzina | |
| 6,066,545 A | 5/2000 | Doshi et al. | |
| 6,090,684 A | 7/2000 | Ishitsuka et al. | |
| 6,107,143 A | 8/2000 | Park et al. | |
| 6,117,722 A | 9/2000 | Wuu et al. | |
| 6,133,071 A | 10/2000 | Nagai | |
| 6,165,383 A | 12/2000 | Chou | |
| 6,221,735 B1 | 4/2001 | Manley et al. | |
| 6,228,694 B1 | 5/2001 | Doyle et al. | |
| 6,246,095 B1 | 6/2001 | Brady et al. | |
| 6,255,169 B1 | 7/2001 | Li et al. | |
| 6,261,964 B1 | 7/2001 | Wu et al. | |
| 6,265,317 B1 | 7/2001 | Chiu et al. | |
| 6,274,444 B1 | 8/2001 | Wang | |
| 6,281,532 B1 | 8/2001 | Doyle et al. | |
| 6,284,623 B1 | 9/2001 | Zhang et al. | |
| 6,284,626 B1 | 9/2001 | Kim | |
| 6,319,794 B1 | 11/2001 | Akatsu et al. | |
| 6,361,885 B1 | 3/2002 | Chou | |
| 6,362,082 B1 | 3/2002 | Doyle et al. | |
| 6,368,931 B1 | 4/2002 | Kuhn et al. | |
| 6,403,486 B1 | 6/2002 | Lou | |
| 6,403,975 B1 | 6/2002 | Brunner et al. | |
| 6,406,973 B1 | 6/2002 | Lee | |
| 6,461,936 B1 | 10/2002 | Von Ehrenwall | |
| 6,476,462 B2 | 11/2002 | Shimizu et al. | |
| 6,493,497 B1 | 12/2002 | Ramdani et al. | |
| 6,498,358 B1 | 12/2002 | Lach et al. | |
| 6,501,121 B1 | 12/2002 | Yu et al. | |
| 6,506,652 B2 | 1/2003 | Jan et al. | |
| 6,509,618 B2 | 1/2003 | Myers et al. | |
| 6,521,964 B1 | 2/2003 | Jan et al. | |
| 6,531,369 B1 | 3/2003 | Ozkan et al. | |
| 6,531,740 B2 | 3/2003 | Bosco et al. | |
| 7,053,400 B2 * | 5/2006 | Sun et al. | 257/19 |
| 7,193,254 B2 * | 3/2007 | Chan et al. | 257/274 |
| 7,202,120 B2 * | 4/2007 | Shima et al. | 438/153 |
| 2001/0009784 A1 | 7/2001 | Ma et al. | |
| 2002/0074598 A1 | 6/2002 | Doyle et al. | |
| 2002/0086472 A1 | 7/2002 | Roberds et al. | |
| 2002/0086497 A1 | 7/2002 | Kwok | |
| 2002/0090791 A1 | 7/2002 | Doyle et al. | |
| 2003/0032261 A1 | 2/2003 | Yeh et al. | |
| 2003/0040158 A1 | 2/2003 | Saitoh | |
| 2003/0057184 A1 | 3/2003 | Yu et al. | |
| 2003/0067035 A1 | 4/2003 | Tews et al. | |
| 2004/0175872 A1 | 9/2004 | Yeo et al. | |
| 2004/0195623 A1 | 10/2004 | Ge et al. | |

FOREIGN PATENT DOCUMENTS

| | | |
|---|---|---|
| EP | 0 967 636 A2 | 12/1999 |
| EP | 1 174 928 A1 | 1/2002 |
| WO | WO 94/27317 | 5/1993 |
| WO | WO 02/054156 | 7/2002 |

OTHER PUBLICATIONS

Rim, et al. "Characteristics and Device Design of Sub-100 nm Strained Si N- and PMOSFETs", 2002 Symposium On VLSI Technology Digest of Technical Papers, IEEE, pp. 98-99.

Scott, et al. "NMOS Drive Current Reduction Caused by Transistor Layout and Trench Isolation Induced Stress", International Electron Devices Meeting, 34.4.1, IEEE, Sep. 1999.

Ootsuka, et al. "A Highly Dense, High-Performance 130nm node CMOS Technology for Large Scale System-on-a-Chip Application", International Electron Device Meeting, 23.5.1, IEEE, Apr. 2000.

Ito, et al. "Mechanical Stress Effect of Etch-Stop Nitride and its Impact on Deep Submicron Transistor Design", International Electron Devices Meeting, 10.7.1, IEEE, Apr. 2000.

Shimizu, et al. "Local Mechanical-Stress Control (LMC): A New Technique for CMOS-Performance Enhancement", International Electron Devices Meeting, IEEE, Mar. 2001.

Ota, et al. "Novel Locally Strained Channel Technique for high Performance 55nm CMOS", International Electron Devices Meeting, 2.2.1, IEEE, Feb. 2002.

Ouyang, et al. "Two-Dimensional Bandgap Engineering in a Novel Si/SiGe pMOSFETS With Enhanced Device Performance and Scalability", Microelectronics Research Center, pp. 151-154, 2000 IEEE.

Sayama et al., "Effect of <Channel Direction for High Performance SCE Immune pMOSFET with Less Than 0.15um Gate Length"ULSI Development Center, pp. 27.5.1-27.5.4, 1999 IEEE.

* cited by examiner

STRUCTURE AND METHOD TO OPTIMIZE STRAIN IN CMOSFETS

FIELD OF THE INVENTION

The present invention relates generally to a semiconductor structure of strained complementary metal oxide semiconductor field effect transistors (CMOSFETs), and a method for fabricating strained MOSFETs that optimizes strain in the MOSFETs, and more particularly pertains to a structure and method that maximizes the strain in one type/kind (N or P) of MOSFET and minimizes and relaxes the strain in another type/kind (P or N) of MOSFET.

Process induced strain has attracted a great deal of attention recently because the strain can enhance the carrier mobility in the channel of a MOSFET. Contact barrier (CA) nitride stress engineering is especially effective in transferring strain into the channel of a MOSFET. Moreover, the process is compatible with and can be easily implemented in the current manufacturing process. The strain in the channel of a MOSFET is proportional to the thickness of the contact barrier (CA) nitride, with a thicker CA nitride causing higher stress in the channel of the MOSFET. Either compressive CA nitride or tensile CA nitride can improve the performance of one kind of MOSFET and degrade the performance of another kind of MOSFET. More specifically, compressive CA nitride improves the performance of PMOSFETs while it degrades the performance of NMOSFETs, and tensile CA nitride improves the performance of NMOSFETs while it degrades the performance of PMOSFETs. The compressive nitride film or tensile nitride film can be selectively deposited by changing the power of the plasma deposition, as is known in the art.

Masked (blocked PFET or blocked NFET) Ge or As implants have been implemented to relax the stress in one kind (N or P) of MOSFET to reduce the degradation while maintaining the strain in another kind (P or N) of MOSFET. A thick CA nitride can cause higher stress in the channel of one kind (N or P) of MOSFET. However, a thick CA nitride makes it harder to relax the stress with Ge or As implants to improve the performance of the other kind (P or N) MOSFET.

SUMMARY OF THE INVENTION

The present invention provides a structure and method to optimize strain in semiconductor devices such as CMOSFETs and has broad applicability to semiconductor devices in general. The subject invention provides a strained semiconductor structure comprising both PMOSFETs and NMOSFETS, and a method for fabricating strained MOSFETs that maximizes the strain in one type/kind (P or N) of MOSFET and minimizes and relaxes the strain in another type/kind (N or P) of MOSFET.

A strain inducing CA nitride coating having an original full thickness is formed over one of the PMOSFET and the NMOSFET, wherein the strain inducing coating produces an optimized full strain in the one semiconductor device. A strain inducing CA nitride coating having an etched reduced thickness, less than the full thickness, is formed over the other of the PMOSFET and the NMOSFET, wherein the reduced thickness of the strain inducing coating relaxes and produces less strain in the other MOSFET.

BRIEF DESCRIPTION OF THE DRAWINGS

The foregoing objects and advantages of the present invention for structure and method to optimize strain in MOSFETs may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE INVENTION

The present invention provides a MOSFET structure with different thicknesses of contact barrier (CA) nitride on NMOSFETs and PMOSFETs that maximizes the strain in one type/kind (P or N) of MOSFET and minimizes and relaxes the strain in another type/kind (N or P) of MOSFET.

Figure 1:
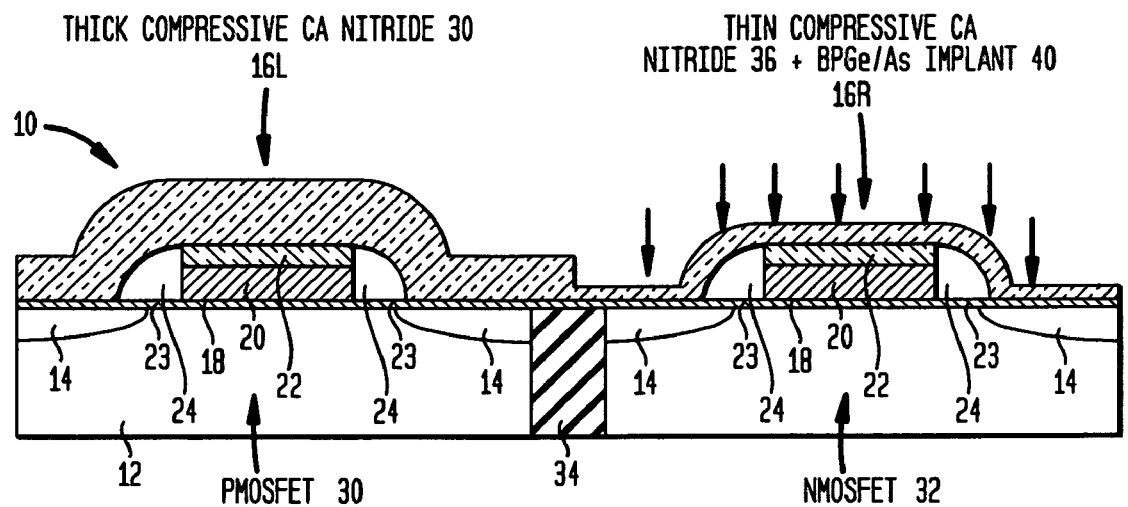
FIG. 1 illustrates a MOSFET structure having a greater thickness of CA compressive nitride on a PMOSFET that maximizes the strain in the PMOSFET and a lesser thickness of CA compressive nitride on an NMOSFET that minimizes and relaxes the strain in the NMOSFET.

FIG. 1 illustrates first and second exemplary embodiments of the present invention on a semiconductor wafer having both PMOSFETs 30 and NMOSFETs 32 separated by isolation regions 34. In the first and second exemplary embodiments of the present invention, compressive CA nitride is used to maximize the strain in the PMOSFETs 30 and minimize and relax the strain in the NMOSFETs 32.

In summary, after deposition of a thick (700-1000 A) compressive CA nitride 36 on both the PMOSFETs 30 and the NMOSFETs 32, the wafer is patterned with photoresist such that the PMOSFETs 30 are covered by photoresist and the NMOSFETs 32 are exposed and not covered by photoresist. The CA nitride at the NMOSFETs 32 is etched thinner at 38 to (300-500A), while the photoresist protects the PMOSFETs 30 from the etch. Therefore, the thinner CA nitride 38 at the NMOSFETs 32 results in less compressive strain at the NMOSFETs 32 than at the PMOSFETs 30, and the NMOSFETs 32 degradation is reduced. FIG. 1 also illustrates that a Ge or As implant 40 can be applied to further relax the strain and improve the NMOSFETs 32 performance.

In a first step, a thick (700-1000 A) layer of compressive CA nitride 36 is deposited on both the PMOSFETs 30 and the NMOSFETs 32 on a wafer.

A blanket layer of photoresist is then deposited over the wafer, and the photoresist is then patterned by using a mask such that the PMOSFETs 30 are covered by photoresist while the NMOSFETs 32 remain exposed and are not covered by the photoresist.

The CA nitride at the NMOSFETs 32 is then etched thinner to (300-500 A) at 38, while the photoresist protects the CA nitride at the PMOSFETs 30 from the etch such that the CA nitride 36 on top of the PMOSFETs 30 remains at the full deposited thickness. Therefore, the thinner CA nitride at 38 on top of the NMOSFETs 32 results in less compressive strain at the NMOSFETs 32 than at the PMOSFETs 30, and the degradation of the NMOSFETs 32 caused by the compressive CA nitride is reduced.

The first embodiment of the present invention is completed with the completion of the above steps. FIG. 1 also illustrates a second embodiment wherein, after completion of the above steps, the NMOSFETs 32 degradation is further reduced by implanting at 40 Ge or As into the NMOSFETs 32. The implant 40 is performed while the PMOSFETs 30 are blocked with a mask, (indicated in the drawing by +B (block) P (PFETs) Ge/As implant 40), which can be the same mask used to pattern the photoresist, to further relax the strain and improve the performance of the NMOSFETs 32.

Figure 2:
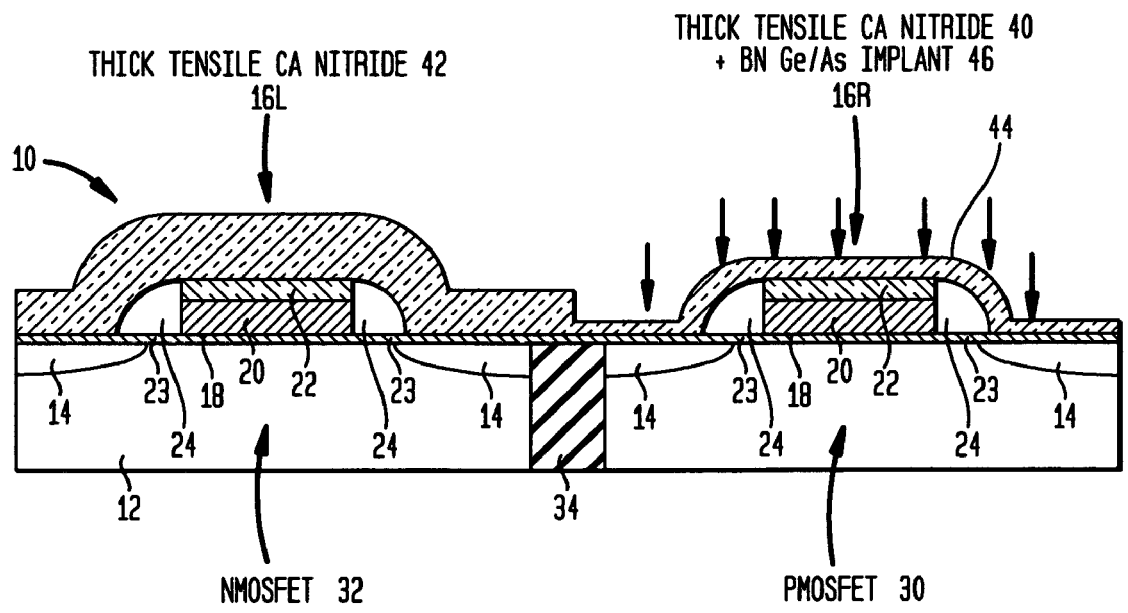
FIG. 2 illustrates a MOSFET structure having a greater thickness of CA tensile nitride on an NMOSFET that maximizes the strain in the NMOSFET and a lesser thickness of CA tensile nitride on a PMOSFET that minimizes and relaxes the strain in the PMOSFET.

FIG. 2 illustrates third and fourth exemplary embodiments of the present invention which show that the same structure and method of FIG. 1 can be applied to tensile CA nitride. In summary, after deposition of a thick (700-1000 A) tensile CA nitride 42 on both the NMOSFETs 32 and the PMOSFETs 30, the wafer is patterned with photoresist such that the NMOSFETs 32 are covered by photoresist while the PMOSFETs 30 are exposed and not covered by photoresist. The CA nitride at the PMOSFETs 30 is etched thinner at 44 to (300-500 A), while the photoresist protects the NMOSFETs 32 from the etch. Therefore, the thinner CA nitride 44 at the PMOSFETs 30 results in less compressive strain at the PMOSFETs 30 than at the NMOSFETs 32, and the PMOSFETs 30 degradation is reduced. FIG. 2 also illustrates at 46 that a Ge or As implant can be applied to further relax the strain and improve the PMOSFETs 30 performance.

In a first step a thick (700-1000 A) layer of tensile CA nitride 42 is deposited on both the PMOSFETs 30 and the NMOSFETs 32 on the wafer.

The wafer is then patterned with photoresist by using a mask such that the NMOSFETs 32 are covered by photoresist and the PMOSFETs 30 remain exposed and are not covered by photoresist.

The CA nitride at the PMOSFETs 30 is then etched thinner to (300-500 A) at 44, while the photoresist protects the CA nitride 42 at the NMOSFETs 34 from the etch such that the CA nitride remains at the full original thickness. Therefore, the thinner CA nitride 44 at the PMOSFETs 30 results in less tensile strain at the PMOSFETs 30 than at the NMOSFETs 32, and the degradation of the PMOSFETs 30 caused by the tensile CA nitride is reduced.

The third embodiment of the present invention is completed with the completion of the above steps. FIG. 2 also illustrates a fourth embodiment wherein, after completion of the above steps, the PMOSFETs 30 degradation is further reduced by implanting at 46 Ge or As into the PMOSFETs 30. The implant 46 is performed while the NMOSFETs 32 are blocked with a mask (indicated in the drawing by +B (block) N (NFETs) Ge/As implant), which can be the same mask used to pattern the photoresist, to further relax the strain and improve the performance of the PMOSFETs 30.

The process conditions for the implant to relax the strain in the nitride film can be:

As or GE

Dose: 5e14 to 2e15

Energy: 20 K to 50 K

The exact implant conditions depend upon the film thickness, and the stress in the film.

The compressive nitride film or tensile nitride film can be selectively deposited by changing the power of the plasma deposition, as is known in the art.

In alternative embodiments, other stress materials can be used in the present invention instead of the nitride film, but the nitride film has an advantage in conformity. The stress inducing film of the present invention can comprise a nitride, preferably $Si_3N_4$, or alternatively TiN, an oxide, a doped oxide such as boron phosphate silicate glass, $Al_2O_3$, $HfO_2$, $ZrO_2$, HfSiO, and other dielectric materials that are common to semiconductor processing or any combination thereof. The stress inducing film can have a thickness ranging from about 10 nm to about 100 nm. The stress inducing film provides a compressive stress in the device channel to improve pFET performance or provides a tensile stress in the device channel to improve nFET performance.

The drawings show an IC structure 10 having two MOSFET device regions formed atop a single semiconductor substrate. Although illustration is made to such an embodiment, the present invention is not limited to the formation of any specific number of MOSFET devices on the surface of the semiconductor structure.

In a more detailed explanation of the fabrication process, the IC structure 10 includes a semiconductor substrate 12, source/drain regions 14 located within the semiconductor substrate 12, and two left and right gate regions 16L and 16R which are located on the surface of the semiconductor substrate 12. Each gate region 16L and 16R includes a gate dielectric 18, a polySi conductor 20, a dielectric cap 22, a dielectric liner 23, spacers 24 and source/drain regions 14 located within the semiconductor substrate 12.

The semiconductor substrate 12 of structure 10 can comprise any semiconducting material including, but not limited to: Si, Ge, SiGe, SiC, SiGeC, Ga, GaAs, InAs, InP and all other III/V compound semiconductors. Semiconductor substrate 12 may also comprise an organic semiconductor or a layered semiconductor such as Si/SiGe, a silicon-on-insulator (SOI) or a SiGe-on-insulator (SGOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

The semiconductor substrate 12 may also include a first doped (n- or p-) region, and a second doped (n- or p-) region. These doped regions are known as "wells". The first doped region and the second doped region may be the same, or they may have different conductivities and/or doping concentrations.

Trench isolation regions 34 are typically already formed in the semiconductor substrate at this point of the present invention utilizing conventional processes well known to those skilled in the art. The trench isolation regions are located to the left and right peripheries of the region shown in the drawings of the present invention as well as between the two gate regions as depicted.

A gate dielectric 18 is formed on the entire surface of the structure 10 including the semiconductor substrate 12 and atop the isolation region, if it is present and if it is a deposited dielectric. The gate dielectric 18 can be formed by a thermal growing process such as, for example, oxidation, nitridation or oxynitridation. Alternatively, the gate dielectric 18 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 18 may also be formed utilizing any combination of the above processes.

The gate dielectric 18 is comprised of an insulating material including, but not limited to: an oxide, nitride, oxynitride and/or silicate including metal silicates and nitrided metal silicates. In one embodiment, it is preferred that the gate dielectric 18 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 18 may vary, but typically, the gate dielectric 18 has a thickness from about 0.5 to about 10 nm, with a thickness from about 0.5 to about 3 nm being more typical.

After forming the gate dielectric 18, a blanket layer of polysilicon (i.e., polySi) which becomes the polySi gate conductor 20 shown in the drawings is formed on the gate dielectric 18 utilizing a known deposition process such as, for example, physical vapor deposition, CVD or evaporation. The blanket layer of polysilicon may be doped or undoped. If doped, an in-situ doping deposition process may be employed in forming the same. Alternatively, a doped polySi layer can be formed by deposition, ion implantation and annealing. The doping of the polySi layer will shift the workfunction of the silicided metal gate formed. Illustrative examples of dopant ions include As, P, B, Sb, Bi, In, Al, Ga, Tl or mixtures thereof. Typical doses for the ion implants are 1E14 ($=1\times10^{14}$) to 1E16 ($=1\times10^{16}$) atoms/cm$^2$ or more typically 1E15 to 5E15 atoms/cm$^2$. The thickness, i.e., height, of the polysilicon layer deposited at this point of the present invention may vary depending on the deposition process employed. Typically, the polysilicon layer has a vertical thickness from about 20 to about 180 nm, with a thickness from about 40 to about 150 nm being more typical.

After deposition of the blanket layer of polysilicon, a dielectric cap 22 is formed atop the blanket layer of polysilicon gate conductor 20 utilizing a deposition process such as, for example, physical vapor deposition or chemical vapor deposition. The dielectric cap 22 may be an oxide, nitride, oxynitride or any combination thereof. The dielectric cap 22 can be comprised of a different dielectric material than spacer 24 to be defined in detail herein below. In one embodiment, a nitride such as, for example, $Si_3N_4$, is employed as the dielectric cap 22. In yet another embodiment, which is preferred, the dielectric cap 22 is an oxide such as $SiO_2$. The thickness, i.e., height, of the dielectric cap 22 is from about 20 to about 180 nm, with a thickness from about 30 to about 140 nm being more typical.

The blanket polysilicon layer and dielectric cap layer are then patterned by lithography and etching so as to provide patterned gate stacks. The patterned gate stacks may have the same dimension, i.e., length, or they can have variable dimensions to improve device performance. Each patterned gate stack at this point of the present invention includes a polySi gate conductor 20 and a dielectric cap 22. The lithography step includes applying a photoresist to the upper surface of the dielectric cap layer, exposing the photoresist to a desired pattern of radiation and developing the exposed photoresist utilizing a conventional resist developer. The pattern in the photoresist is then transferred to the dielectric cap layer and the blanket layer of polysilicon utilizing one or more dry etching steps. In some embodiments, the patterned photoresist may be removed after the pattern has been transferred into the dielectric cap layer. In other embodiments, the patterned photoresist is removed after etching has been completed.

Suitable dry etching processes that can be used in the present invention in forming the patterned gate stacks include, but are not limited to: reactive ion etching, ion beam etching, plasma etching or laser ablation. The dry etching process employed is typically selective to the underlying gate dielectric 18 therefore this etching step does not typically remove the gate dielectric. In some embodiments, this etching step may however be used to remove portions of the gate dielectric 18 that are not protected by the gate stacks. A wet etching process can also be used to remove portions of the gate dielectric 18 that are not protected by the gate stacks.

Next, a dielectric liner 23 is formed on all exposed surfaces containing silicon including at least the polysilicon gate conductor 20. The dielectric liner 23 can also extend onto horizontal surfaces of the semiconductor substrate 12. The dielectric liner 23 may comprise any dielectric material that contains an oxide, nitride, oxynitride or any combination thereof. The dielectric liner 23 is formed via a thermal growing process such as oxidation, nitridation or oxynitridation. The dielectric liner 23 is a thin layer whose thickness is typically from about 1 to about 10 nm.

At least one spacer 24 is formed on exposed sidewalls of each patterned gate stack as well as atop the dielectric liner. The at least one spacer 24 is comprised of an insulator such as an oxide, nitride, oxynitride and/or any combination thereof and it typically is composed of a different material than the dielectric liner 23 and the dielectric cap 22. Preferably, nitride spacers are formed. The at least one spacer 24 is formed by deposition and etching. Note that the etching step used in forming the spacers 24 also can remove dielectric liner 23 from atop the substrate such that a portion of the semiconductor substrate 12 is exposed.

The width of the spacer 24 must be sufficiently wide such that the source and drain silicide contacts (to be subsequently formed) do not encroach underneath the edges of the gate stack. Typically, the source/drain silicide does not encroach underneath the edges of the gate stack when the spacer has a width, as measured at the bottom, from about 15 to about 80 nm.

After spacer formation, source/drain diffusion regions 14 are formed into the substrate 12 at the exposed portions. The source/drain diffusion regions 14 are formed utilizing ion implantation and an annealing step. The annealing step serves to activate the dopants that were implanted by the previous implant step. The conditions for the ion implantation and annealing are well known to those skilled in the art.

Next, as shown in FIGS. 1 and 2, the thick compressive or tensile CA nitride film 30 or 42 is formed over the entire structure shown in FIGS. 1 and 2 and further fabrication and processing proceeds as described in detail above to form the thin compressive or tensile CA nitride film 36 or 44, and possibly the GE/As implant 40 or 46.

After fabricating the structures shown in FIGS. 1 and 2, a planarizing dielectric layer (not shown) can be formed. The planarizing dielectric layer comprises an oxide such as a high density oxide or an oxide deposited from TEOS. Alternatively, the planarizing dielectric layer may comprise a doped silicate glass, such as boron doped silicate glass (BSG) or phosphorus doped silicate glass (PSG), a spin-coatable polymeric material such as hydrogen silsesquioxane (HSQ), or a photoresist. The planarizing dielectric layer is formed by conventional techniques well known to those skilled in the art. The thickness of the planarizing dielectric layer formed at this point may vary depending on the type of material employed. Typically, the planarizing dielectric layer has a thickness from about 50 to about 100 nm.

While several embodiments and variations of the present invention for a structure and method to optimize strain in CMOSFETs are described in detail herein, it should be apparent that the disclosure and teachings of the present invention will suggest many alternative designs to those skilled in the art.

What is claimed is:

1. A semiconductor structure comprising:

a p-semiconductor device and an n-semiconductor device formed on a substrate; and a single strain inducing layer comprising a first thickness over the p-semiconductor device, and a second thickness over the n-semiconductor device, wherein the second thickness is less than the first thickness.

2. The semiconductor structure of claim 1, wherein the single strain inducing layer of the first thickness produces a first strain in a channel of the p-semiconductor device and the single strain inducing layer of the second thickness produces a second strain in the n-semiconductor device, wherein the first strain is a compressive strain greater than the second strain.

3. The semiconductor structure of claim 2, wherein the semiconductor device further comprises a dopant to relax the strain in the n-semiconductor device.

4. The semiconductor structure of claim 3, wherein the dopant comprises As or Ge.

5. The semiconductor structure of claim 1, wherein the p-semiconductor device is a p-type MOSFET and the n-semiconductor device is an n-type MOSFET.

6. The semiconductor structure of claim 1, wherein the singe strain inducing layer comprises $Si_3N_4$.

* * * * *